US011566771B2

(12) United States Patent
Droegeler et al.

(10) Patent No.: US 11,566,771 B2
(45) Date of Patent: Jan. 31, 2023

(54) HEATSINK WITH PROTRUDING PINS AND METHOD OF MANUFACTURE

(71) Applicant: LUMILEDS LLC, San Jose, CA (US)

(72) Inventors: Marc Droegeler, Aachen (DE); Thorsten Lenzen, Aachen (DE); Matthias Holtrup, Aachen (DE); Joseph Hendrik Anna Maria Jacobs, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/748,694

(22) Filed: May 19, 2022

(65) Prior Publication Data

US 2022/0373156 A1 Nov. 24, 2022

Related U.S. Application Data

(60) Provisional application No. 63/190,536, filed on May 19, 2021.

(51) Int. Cl.

| | |
|---|---|
| ***H01L 33/64*** | (2010.01) |
| ***F21S 45/47*** | (2018.01) |
| ***F21S 41/141*** | (2018.01) |
| ***F21K 9/68*** | (2016.01) |
| ***F21K 9/90*** | (2016.01) |
| *F21Y 115/10* | (2016.01) |
| *F21W 107/10* | (2018.01) |

(52) U.S. Cl.

CPC ................ *F21S 45/47* (2018.01); *F21K 9/68* (2016.08); *F21K 9/90* (2013.01); *F21S 41/141* (2018.01); *F21W 2107/10* (2018.01); *F21Y 2115/10* (2016.08)

(58) Field of Classification Search

None

See application file for complete search history.

(56) References Cited

U.S. PATENT DOCUMENTS 4,460,917 A * 7/1984 Rogers .................... H01L 23/32 257/796
7,837,354 B2 11/2010 Mo et al.
2012/0169235 A1 7/2012 Dassanayake et al.
2017/0062688 A1* 3/2017 Zhu ......................... H01L 33/62

OTHER PUBLICATIONS

International Search Report and Written Opinion dated Sep. 27, 2022 for PCT International Application No. PCT/US2022/030060.

* cited by examiner

*Primary Examiner* — Elmito Breval
(74) *Attorney, Agent, or Firm* — Volpe Koenig

(57) ABSTRACT

A heatsink, a light-emitting diode (LED) module and a corresponding method of manufacture are described. A heatsink includes an electrically conductive heatsink core and an electrically insulating layer covering at least the first surface of the electrically conductive heatsink core. The electrically conductive heatsink core has a first pin that is integral with the electrically conductive heatsink core and protrudes from a first surface of the heatsink core. At least the first surface of the heatsink core is covered by an electrically insulating layer, which leaves at least portions of a lateral surface of the first pin exposed from the electrically insulating layer.

17 Claims, 6 Drawing Sheets

HEATSINK WITH PROTRUDING PINS AND METHOD OF MANUFACTURE

CROSS REFERENCE TO RELATED APPLICATIONS

This application claims the benefit of U.S. Non-Provisional Patent Application No. 63/190,536, which was filed on May 19, 2021, the contents of which are hereby incorporated by reference herein.

BACKGROUND

Light emitting diodes (LEDs) are more and more replacing older technology light sources due to superior technical properties, such as energy efficiency and lifetime. This is also true for demanding applications, for example in terms of luminance, luminosity, and/or beam shaping (such as for vehicle headlighting). However, despite their energy efficiency, LEDs, and especially high-power ones, may still develop considerable heat, which may require cooling, which may typically be done by connecting the LED to a heatsink, to keep LED junction temperatures low. Such heat sinking is often used in many other high-power semiconductor components.

SUMMARY

A heatsink, a light-emitting diode (LED) module and a corresponding method of manufacture are described. A heatsink includes an electrically conductive heatsink core and an electrically insulating layer covering at least the first surface of the electrically conductive heatsink core. The electrically conductive heatsink core has a first pin that is integral with the electrically conductive heatsink core and protrudes from a first surface of the heatsink core. At least the first surface of the heatsink core is covered by an electrically insulating layer, which leaves at least portions of a lateral surface of the first pin exposed from the electrically insulating layer.

BRIEF DESCRIPTION OF THE DRAWINGS

A more detailed understanding can be had from the following description, given by way of example in conjunction with the accompanying drawings wherein.

DETAILED DESCRIPTION

Figure 1:
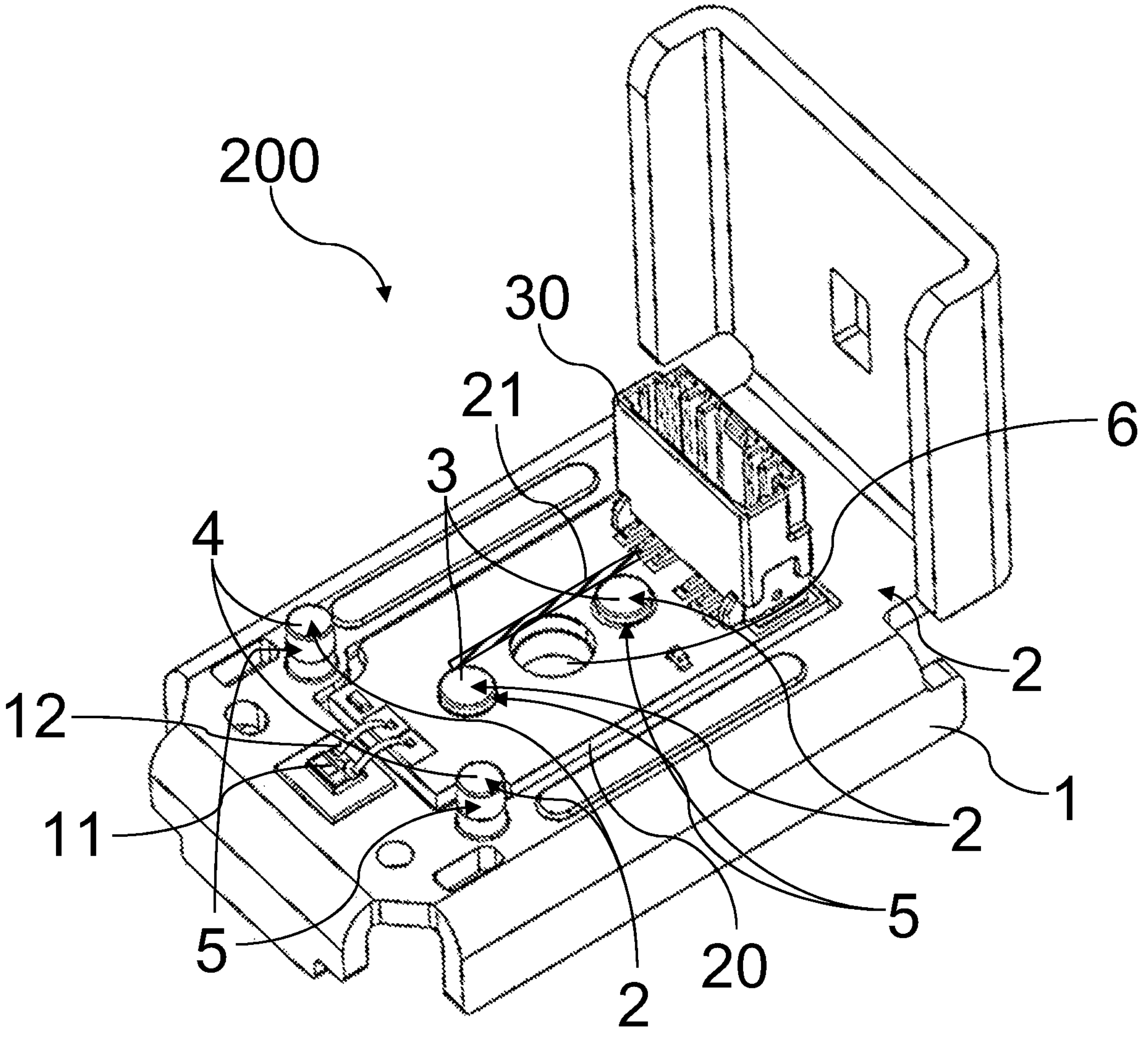
FIG. 1 is a schematic perspective view of an LED module with a heatsink.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Halogen lamps have been the default light source for many years for automotive head lighting. However, recent advances in LED technology with concomitant new design possibilities and energy efficiency has spurred interest in finding a legal replacement for halogen that is based on LED technology, so-called LED retrofits. Such LED retrofits have been on the market for a couple of years and are a popular aftermarket replacement for halogen head lamps. However, almost all of these retrofits do not fulfil the legal requirements and hence are not allowed on the road.

LEDs, or semiconductor components in general, are vulnerable devices needing protection not only against mechanical damage but, for example, also against strong electrical fields and, more particularly, against electrostatic discharges ("ESDs") occurring via them or in their vicinity. Such ESD events, thus, should be avoided or, at least, should be alleviated, such as by foreseeing grounded elements near the LEDs.

Electrostatic charge near an LED may build up for various reasons. For example, electrically non-conducting materials may exist in the vicinity of the LED. However, conducting elements may also present an issue if electrostatic charge may accumulate on them, such as because they are insulated from defined potentials and in particular from ground potential. In the case of LEDs, the latter may, for example, apply to optical components processing the light emitted by the LED in operation. There are, for example, LED modules that may need to be attached to a reflector close to the LED. The reflector may have a reflective surface facing the LED, with the reflective surface typically being made of an electrically conducting metal layer applied on an electrically non-conducting plastic body, thus, insulating the metal layer from defined and in particular from ground potential.

ESD events may also be evoked by heatsinks connected to the LEDs for their thermal management. This may happen even if a metal heatsink is used for good thermal conductivity, and metal, of course, is a good electrical conductor. Aluminum heatsinks may be anodized, meaning that their surfaces are oxidized to increase their surface emissivity for increased radiation heat transfer from the heatsink to the environment. Anodization layers, such as oxides, however, may be electrical insulators and, thus, may block an electrical contact of the Al core of the heatsink to components mounted to the heatsink, such as optical components (e.g., a reflector) or electrical components (e.g., a printed circuit board (PCB) supplying the LEDs with electrical power. Even more detrimental, such insulating layers may accumulate electrostatic charge themselves.

One way to alleviate ESD issues, such as described above, may be to ground the metal heatsink core and expose such ground potential at the insulated surface layer of the heatsink by using metal screws as fasteners with the screws electrically contacting the metal core. Such scheme is described, for example, in U.S. Pat. No. 7,837,354, which is hereby incorporated by reference herein. The screw heads, then being grounded as well, can discharge nearby electrostatic charges. However, such scheme requires special screws with teeth at the back side of the screw heads scraping through the insulated surface layer into the metal core, or the insulation layer needs to be removed at the position of the screw heads.

Additionally, many applications do not use screws are fasteners, or electrically non-conducting screws, such as plastic, screws are used. In applications where metal screws are used, with standard screws, the electrical contact mediated by such screws may typically only occur pointwise as for avoiding stress on screwing and because of manufacturing tolerances, screw diameters may be dimensioned slightly smaller than screw hole diameters. Pointwise contact, however, may have a limited electrical conductivity and, thus, may not be able to reliably discharge large electrostatic potentials. Additionally, reliably grounding the metal core of the heatsink, without removing the insulated surface layer in an additional manufacturing step, may be an issue in itself. Embodiments described herein may address the ESD problem, in connection with heatsinks, for LED modules in particular but also for other semiconductor modules in general, by using elements, such as alignment or other pins, typically present in heatsinks.

FIG. 1 is a schematic perspective view of an LED module 200 comprising a heatsink 1, three LEDs 11 electrically coupled via ribbon bonds 12 to a PCB 20, and a connector 30 mounted via the PCB 20 to the heatsink 1. The heatsink 1 may include protruding pins 3 and 4, which protrude from a top surface (not labeled) of the heatsink. Pins 3 may serve for fastening the PCB 20 to heatsink 1, and pins 4 may serve as alignment elements for a reflector 40 to be mounted to heatsink 1 (see FIG. 2). The surface of heatsink 1 may be covered by an electrically insulating layer 2, which may also cover the top surfaces of pins 3, 4. However, the lateral (or side) surfaces 5 of pins 3, 4 may, at least partially, not be covered by insulating layer 2, exposing the material of the heatsink core to the environment.

The heatsink core may be made of an electrically conductive material, such as Aluminum (Al) for its good thermal properties, low weight, and comparably low price. The insulation layer 2, with an Al core, may result from anodizing (oxidizing) the Al surface, which may be done for improving radiative heat transfer to the environment of the heatsink. In some embodiments, the heatsink may be manufactured from a sheet metal as a raw shape for making the heatsink 1. In such embodiments, the pins 3, 4 may be stamped or deep drawn from the heatsink's raw shape, as described in more detail below with respect to FIGS. 3 and 4. Such stamping/deep drawing process, while maintaining the insulation layer 2 at the top surface of a pin, according to an embodiment, may be performed in a manner that the insulating layer 2, in the stamping/deep drawing, does not follow the increasing lateral surface area of the pin. Thus, in a sense, the insulating layer 2 may rupture on stamping/deep drawing. This may result in the lateral surfaces 5 of pins 3, 4, at least partially, not being covered by insulating layer 2.

However, this disclosure does not require making the heatsink from a sheet metal raw shape and making the pins by stamping or deep drawing is not a requirement, and the embodiments described herein may encompass all other manufacturing methods as well, including making the heatsink with the protruding pins, such as by die casting. As far as such other manufacturing methods result in the pins' lateral surfaces being covered by the insulating layer of the heatsink, the insulating layer at the lateral surfaces of the pins may need to be, at least partially, removed by afterwards machining, such as by grinding, milling, or laser ablating, to name just a few options. Alternatively, masking and layer removal, such as by etching processes, may be used to achieve lateral pin surfaces exposing, at least partially, the heatsink core material to the environment.

Even in the case of such additional manufacturing steps, the embodiments described herein may offer the advantage of relying, for ESD protection, only on the pins already present in the heatsink (e.g. for fastening and/or alignment reasons) and, thus, may not require additional or special elements, such as electrically conductive screws.

The pins 3 may be used to fasten the PCB 20 to heatsink 1, such as in a riveting like manner. For that, the pins 3 may have the shape of an upright cylinder, and the PCB 20 may have through holes (not shown) corresponding to the pins 3. For mounting the PCB 20 to the heatsink 1, the PCB 20 may be placed on heatsink 1 with pins 3 penetrating the through holes. The heads of pins 3 may be deformed to touch the upper surface of PCB 20, thereby fixing PCB 20 to heatsink 1. On deforming the heads, the electrically conductive material from uncovered parts of the lateral surfaces 5 of pins 3, may touch the upper surface of PCB 20. An electrically conductive track 21 (schematically indicated only) on the PCB's upper surface below the deformed heads of pins 3, may thereby make electrical contact to the heatsink's electrically conductive core material and connect the heatsink core to a contact in connector 30, which may be connected to an external ground potential. In this way, the heatsink core may be grounded without additional or special construction elements like electrically conductive screws.

Grounding the heatsink core via the connector 30, electrically conductive track 21, and the deformed heads of pins 3 may expose such ground potential also at the non-coated lateral surfaces 5 of pins 3, 4, whereby nearby electrostatic charge may be discharged via the lateral surfaces 5 of pins 3, 4. Thus, by modifying the already present pins 3, 4 in this way, may allow an easy grounding of the heatsink core with such ground potential being carried by the lateral surfaces 5 of pins 3, 4 to the surface of the heatsink without any additional or even special elements.

Figure 2:
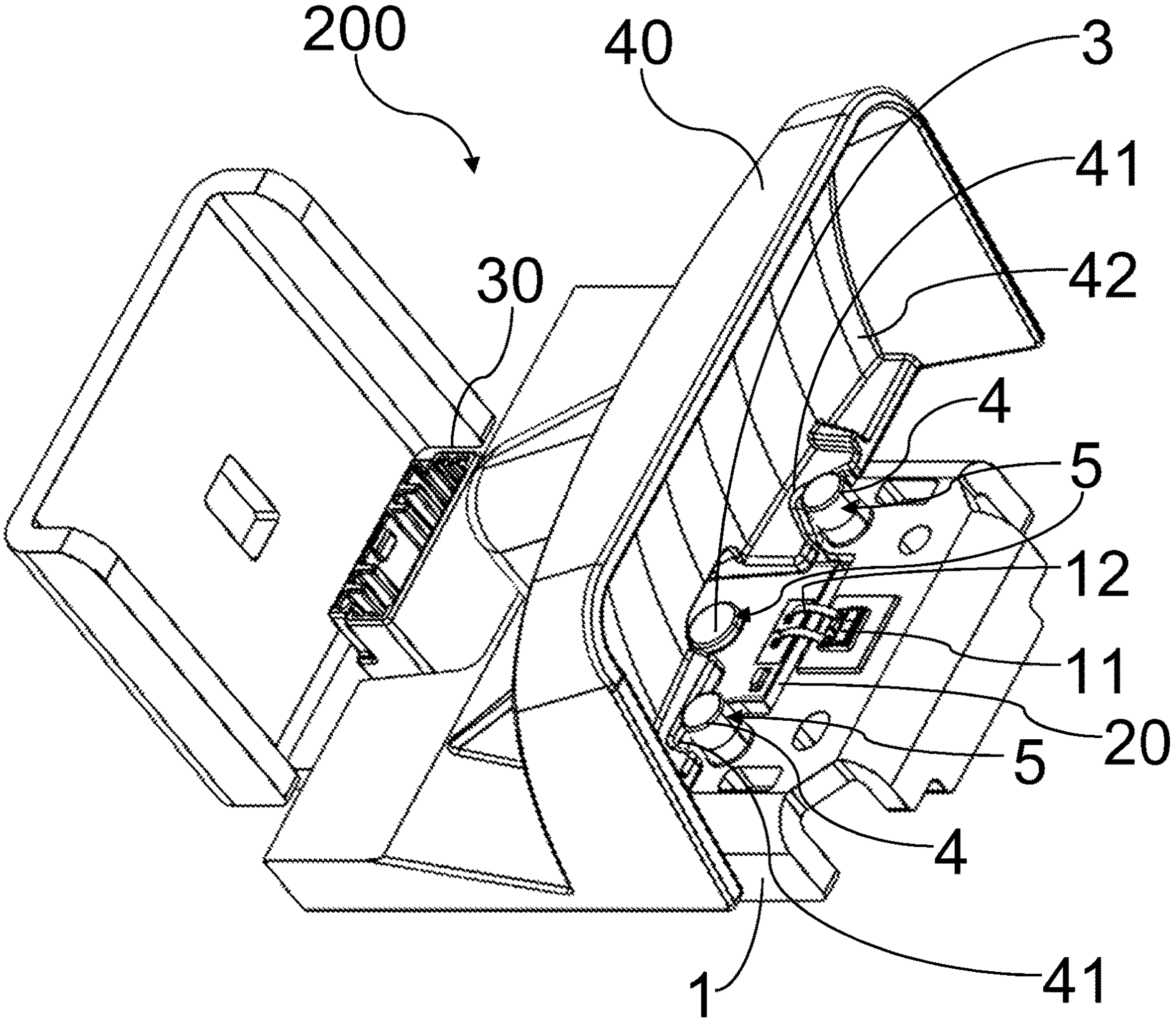
FIG. 2 is a schematic perspective view of the LED module of FIG. 1 with a reflector added.

FIG. 2 is another perspective view of the LED module of FIG. 1 (rotated approximately 90° rotated around an axis perpendicular to the heatsink plane and centered thereto) with a reflector 40 mounted to the heatsink 1. The reflector 40 may be mounted by a fastener (not shown) penetrating the through hole 6 in PCB 20 and heatsink 1 (cf. FIG. 1), and carve outs 41 of reflector 40, in a form-fit manner, may touch the lateral surfaces 5 of pins 4, thereby aligning reflector 40 with respect to the three LEDs 11. Two ribbon bonds 12 may electrically couplet LEDs 11 to conductive tracks (not shown) of PCB 20 (further connecting to contacts within connector 30).

Making the reflective surface 42 of reflector 40 out of an electrically conductive material, such metal, and extending such reflective surface 42 up to and covering the carve outs 41 may generate an electrically conductive contact over the full contact area of carve outs 41 with lateral surfaces 5 of pins 4. Thereby, the reflective surface 41 may be coupled with high electric conductivity to the heatsink core. Together with the elements described above with respect to FIG. 1, the reflective surface 41 may be grounded by coupling, via carve outs 41, lateral surfaces 5 of pins 4, the heatsink core, the lower sides of deformed heads of pins 3, conductive track 21 of PCB 20, and connector 30 to an external ground lead. This may alleviate build-up of electrostatic charge on reflective surface 41, generated, for example, by polishing reflector 40, and jump over of such electrostatic charge to LEDs 11, which may otherwise be harming the LEDs.

Figure 3:
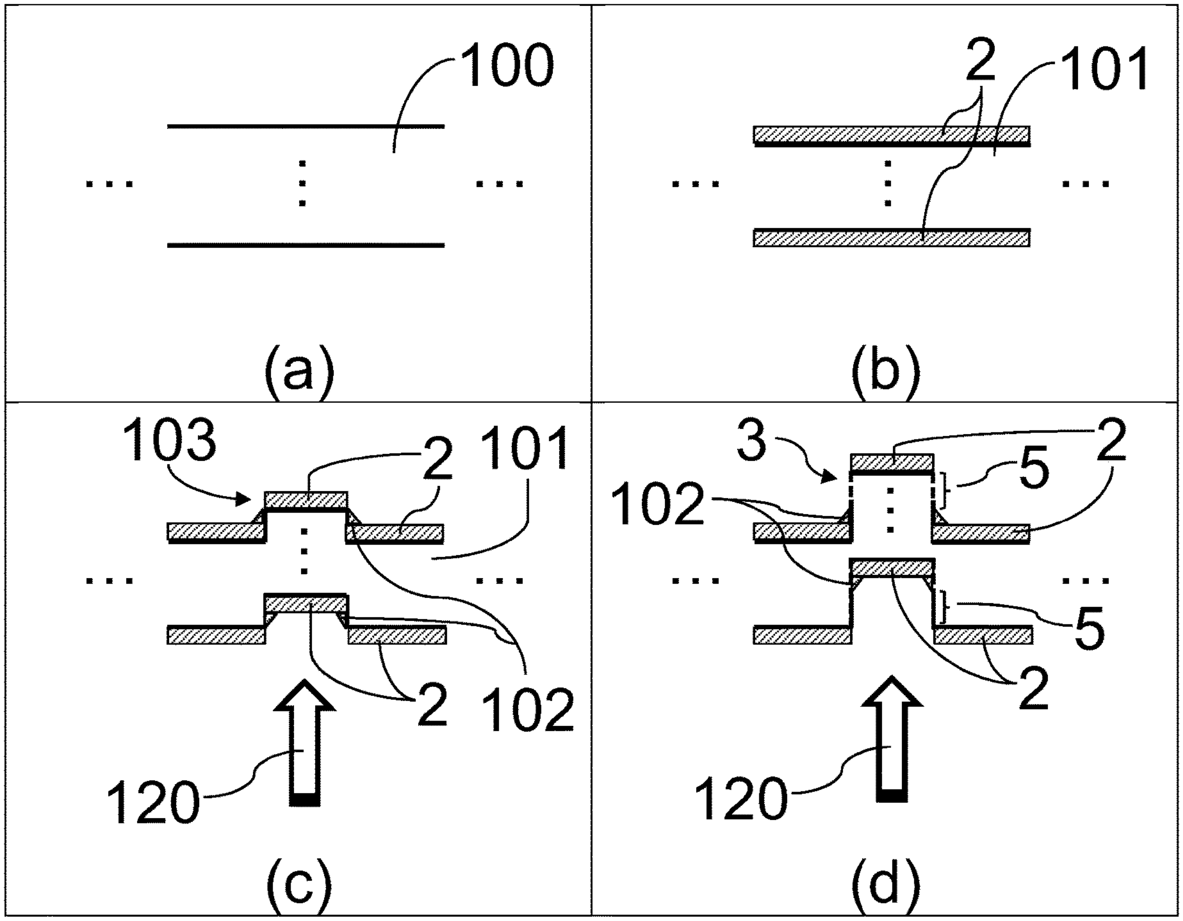
FIG. 3 is a schematic cross-sectional view of a heatsink at various stages in a method of manufacture.
Figure 4:
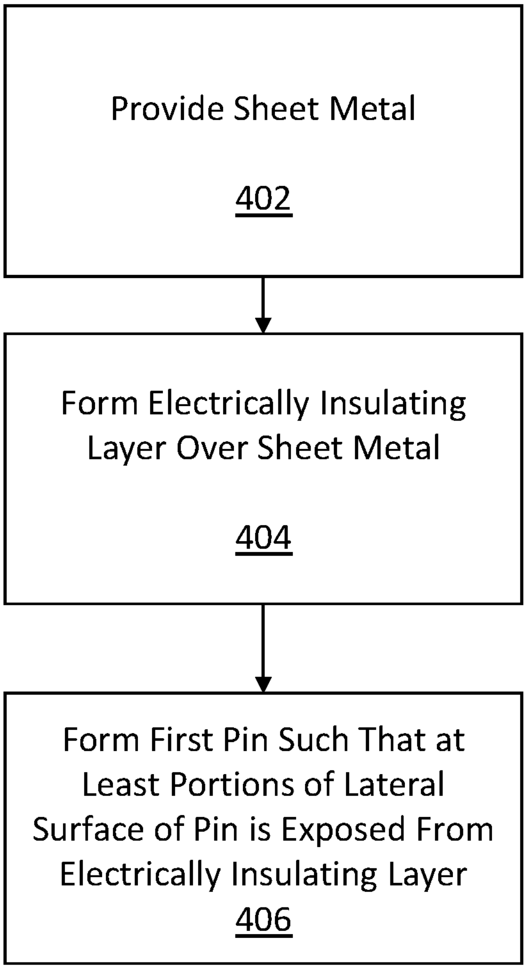
FIG. 4 is a flow diagram of the example method of FIG. 3.

FIG. 3 is a schematic cross-sectional view of a heatsink at various stages in a method of manufacture. FIG. 4 is a flow diagram of the example method of FIG. 3.

A piece of sheet metal may be provided (402). In some embodiments, the sheet metal may be an AL sheet. The sheet metal at this stage in the method is shown in FIG. 3(*a*) as sheet metal 100. In FIG. 3, the dots may indicate a continuing extension of the sheet in the two length (left and right) and the thickness (vertical) directions.

An electrically insulating layer may be formed over the sheet metal (404). FIG. 3(*b*) shows the sheet metal after the insulating layer 2 is formed over the sheet metal, which may also be referred to as heatsink core 101. In some embodiments, as described above, this may be done by anodizing a surface of the sheet metal 100. However, it may be formed in a variety of manners, as described above.

A first pin may be formed such that at least portions of a lateral surface of the first pin is exposed from the electrically insulating layer (406). This may be done, for example, by deep drawing and/or stamping the first pin. FIG. 3(*c*) shows the first stages of applying a stamp (not shown) moving in direction 120 to finally make protruding pin 3 by stamping or deep drawing. FIG. 3(*c*) shows the beginning shape 103 of pin 3. It can be seen that insulating layer 2 on the pin head and bottom may follow the stamping/deep drawing process. However, choosing appropriate process parameters according to the embodiments described herein, on the lateral surfaces of the beginning protruding pin 103 (the vertical surfaces in the figure), insulating layer 2 may, over time, increasingly not follow the stamping/deep drawing and, thus, may start to thin out. This is schematically indicated in FIG. 3(*c*) as the insulating layer 2 forming triangles 102. Continuing the stamping/deep drawing in direction 120 may finally leave large parts of the lateral surfaces 5 free of insulating layer 2. This can be seen in FIG. 3(*d*) where the dashed vertical lines indicate that the uncovered parts of the lateral surfaces 5, marked by the curly brackets, have a much larger extension than the remaining parts covered by the remains 102 of insulating layer 2.

As anodizing, and in particular deep drawing, are typically preferred process steps of forming a heatsink from an Al sheet metal, such manufacturing method may alleviate the ESD problem without any additional process steps or the use of any additional or specialized components.

To improve the thermal contact of LEDs 11 to heatsink 1 (cf. FIG. 2), as the insulating layer 2 may have a lower thermal conductivity than the heatsink core, the insulating layer 2 may be removed below the LEDs 11, such as in the part of heatsink 1 serving as mounting area for LEDs 11. Such removal of insulating layer 2 in the LED mounting area may be performed by any suitable method, such as grinding, milling, or laser ablating.

Such method may also be used to a second pin and/or one or more additional first or second pins. These pins may be used, for example, for aligning and attaching a circuit board and a reflector to the heatsink (e.g., the first pins may be used for one of the circuit board or the reflector and the other may be used to align and attach the other one of the circuit board or the reflector to the heatsink). The method may further include mounting the reflector and/or the circuit board to the heatsink.

Figure 5:
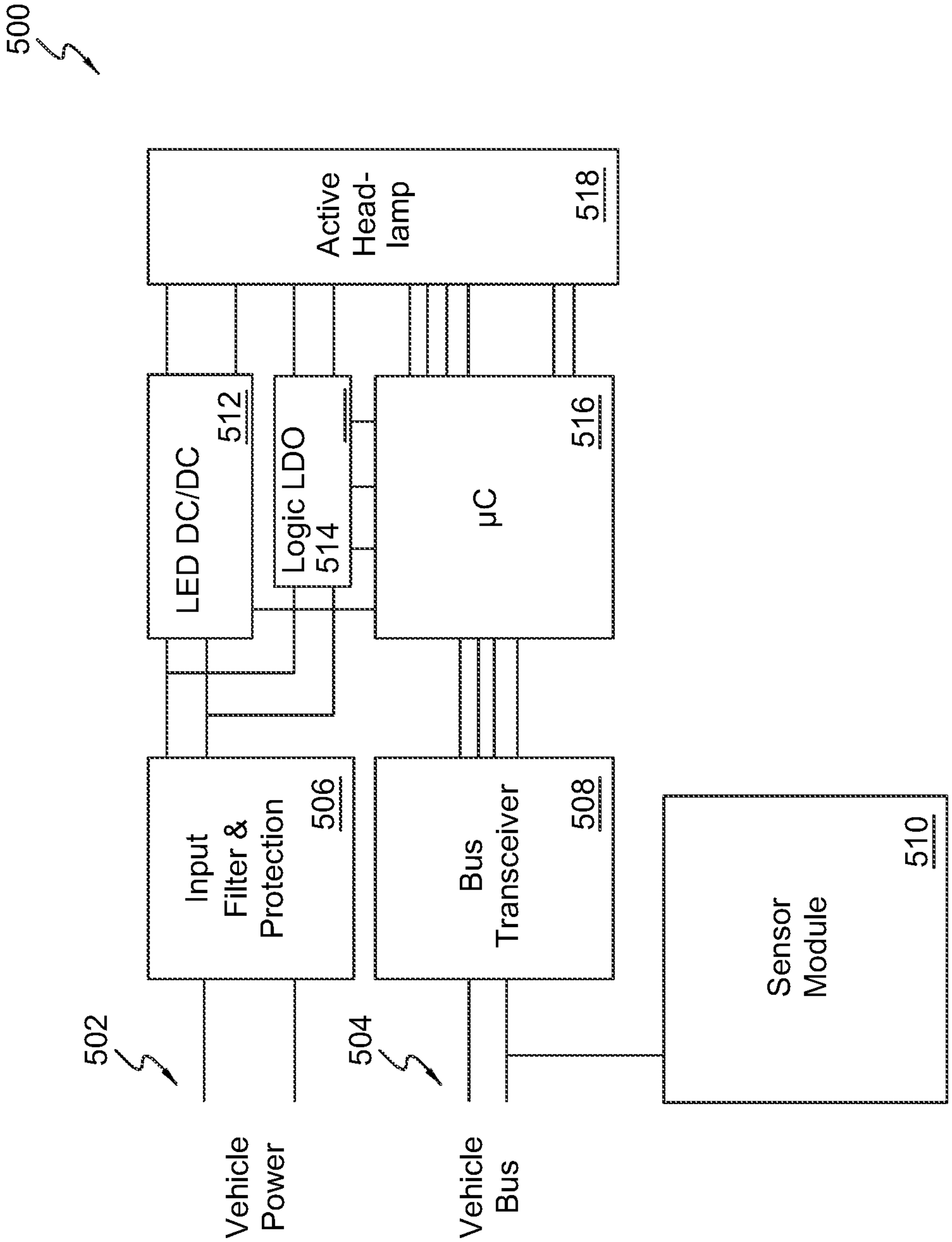
FIG. 5 is a diagram of an example vehicle headlamp system.

FIG. 5 is a diagram of an example vehicle headlamp system 500 that may incorporate one or more of the embodiments and examples described herein. The example vehicle headlamp system 500 illustrated in FIG. 5 includes power lines 502, a data bus 504, an input filter and protection module 506, a bus transceiver 508, a sensor module 510, an LED direct current to direct current (DC/DC) module 512, a logic low-dropout (LDO) module 514, a micro-controller 516 and an active head lamp 518.

The power lines 502 may have inputs that receive power from a vehicle, and the data bus 504 may have inputs/outputs over which data may be exchanged between the vehicle and the vehicle headlamp system 500. For example, the vehicle headlamp system 500 may receive instructions from other locations in the vehicle, such as instructions to turn on turn signaling or turn on headlamps, and may send feedback to other locations in the vehicle if desired. The sensor module 510 may be communicatively coupled to the data bus 504 and may provide additional data to the vehicle headlamp system 500 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 500. In FIG. 5, the headlamp controller may be a micro-controller, such as micro-controller (pc) 516. The micro-controller 516 may be communicatively coupled to the data bus 504.

The input filter and protection module 506 may be electrically coupled to the power lines 502 and may, for example, support various filters to reduce conducted emissions and provide power immunity. Additionally, the input filter and protection module 506 may provide electrostatic discharge (ESD) protection, load-dump protection, alternator field decay protection, and/or reverse polarity protection.

The LED DC/DC module 512 may be coupled between the input filter and protection module 506 and the active headlamp 518 to receive filtered power and provide a drive current to power LEDs in the LED array in the active headlamp 518. The LED DC/DC module 512 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 514 may be coupled to the input filter and protection module 506 to receive the filtered power. The logic LDO module 514 may also be coupled to the micro-controller 516 and the active headlamp 518 to provide power to the micro-controller 516 and/or electronics in the active headlamp 518, such as CMOS logic.

The bus transceiver 508 may have, for example, a universal asynchronous receiver transmitter (UART) or serial peripheral interface (SPI) interface and may be coupled to the micro-controller 516. The micro-controller 516 may translate vehicle input based on, or including, data from the sensor module 510. The translated vehicle input may include a video signal that is transferrable to an image buffer in the active headlamp 518. In addition, the micro-controller 516 may load default image frames and test for open/short pixels during startup. In embodiments, an SPI interface may load an image buffer in CMOS. Image frames may be full frame, differential or partial frames. Other features of micro-controller 516 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 6:
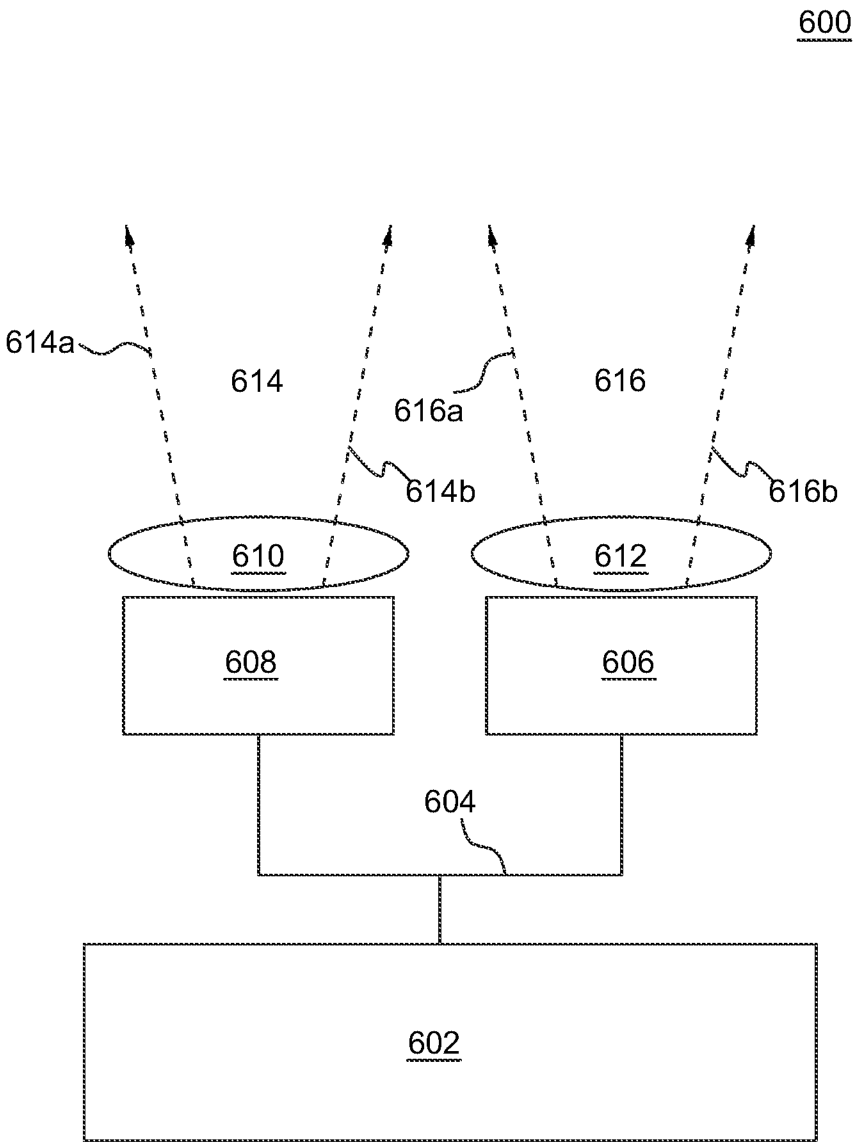
FIG. 6 is a diagram of another example vehicle headlamp system.

FIG. 6 is a diagram of another example vehicle headlamp system 600. The example vehicle headlamp system 600 illustrated in FIG. 6 includes an application platform 602, two LED lighting systems 606 and 608, and secondary optics 610 and 612.

The LED lighting system 608 may emit light beams 614 (shown between arrows 614*a* and 614*b* in FIG. 6). The LED lighting system 606 may emit light beams 616 (shown between arrows 616*a* and 616*b* in FIG. 6). In the embodiment shown in FIG. 6, a secondary optic 610 is adjacent the LED lighting system 608, and the light emitted from the LED lighting system 608 passes through the secondary optic 610. Similarly, a secondary optic 612 is adjacent the LED lighting system 606, and the light emitted from the LED lighting system 606 passes through the secondary optic 612. In alternative embodiments, no secondary optics 610/612 are provided in the vehicle headlamp system.

Where included, the secondary optics 610/612 may be or include one or more light guides. The one or more light guides may be edge lit or may have an interior opening that defines an interior edge of the light guide. LED lighting systems 608 and 606 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 608 and 606 in a desired manner, such as, for example, with a gradient, a chamfered distribution, a narrow distribution, a wide distribution, or an angular distribution.

The application platform 602 may provide power and/or data to the LED lighting systems 606 and/or 608 via lines 604, which may include one or more or a portion of the power lines 502 and the data bus 504 of FIG. 5. One or more sensors (which may be the sensors in the vehicle headlamp system 600 or other additional sensors) may be internal or external to the housing of the application platform 602. Alternatively, or in addition, as shown in the example vehicle headlamp system 500 of FIG. 5, each LED lighting system 608 and 606 may include its own sensor module, connectivity and control module, power module, and/or LED array.

In embodiments, the vehicle headlamp system 600 may represent an automobile with steerable light beams where LEDs may be selectively activated to provide steerable light. For example, an array of LEDs or emitters may be used to define or project a shape or pattern or illuminate only selected sections of a roadway. In an example embodiment, infrared cameras or detector pixels within LED lighting systems 606 and 608 may be sensors (e.g., similar to sensors in the sensor module 510 of FIG. 5) that identify portions of a scene (e.g., roadway or pedestrian crossing) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A heatsink comprising:

an electrically conductive heatsink core comprising a first pin that is integral with the electrically conductive heatsink core and protrudes from a first surface of the heatsink core; and an electrically insulating layer covering at least the first surface of the electrically conductive heatsink core and leaving at least portions of a lateral surface of the first pin exposed from the electrically insulating layer.

2. The heatsink according to claim 1, wherein the first pin is configured for one of mechanical coupling with a circuit board or at least one optical element.

3. The heatsink according to claim 2, further comprising a second pin configured for the other one of the mechanical coupling with the circuit board or the at least one optical element.

4. The heatsink according to claim 3, wherein the second pin is integral with the electrically conductive heatsink core, protrudes from the surface of the heatsink core, and has at least portions of a lateral surface thereof exposed from the electrically insulating later.

5. The heatsink according to claim 1, further comprising a light-emitting diode (LED) mounting area that is also exposed from the electrically insulating layer.

6. An LED module comprising:

a heatsink comprising:

an electrically conductive heatsink core comprising a first pin that is integral with the electrically conductive heatsink core and protrudes from a first surface of the heatsink core, an electrically insulating layer covering at least the first surface of the electrically conductive heatsink core and leaving at least portions of a lateral surface of the first pin exposed from the electrically insulating layer, and a light-emitting diode (LED) mounting area that is also exposed from the electrically insulating layer; and an LED mounted on the LED mounting area of the heatsink.

7. The LED module according to claim 6, further comprising:

a printed circuit board (PCB) having at least a first surface and second surface opposite the first surface, the PCB comprising:

electrically conductive traces on at least the first surface of the PCB, an electrical connector on the first surface of the PCB and electrically coupled to electrically conductive traces, and a through hole, wherein the PCB is mounted on the first surface of the PCB such that the first pin of the heatsink penetrates the through hole in the PCB, a head of the first pin is deformed and the deformed head of the first pin electrically couples the heatsink core to ground via the at least the portion of the lateral surface of the first pin that is exposed from the electrically insulating layer and one of the electrically conductive traces on the at the at least the first surface of the PCB.

8. The LED module according to claim 6, further comprising:

a second pin that is integral with the electrically conductive heatsink core, protrudes from the surface of the heatsink core, and has at least portions of a lateral surface thereof exposed from the electrically insulating later; and a reflector mounted on the first surface of the heatsink via the second pin.

9. The LED module according to claim 8, wherein the reflector comprises a carve out touching at least one of the at least portions of the lateral surface of the first pin that are exposed from the electrically insulating layer.

10. The LED module according to claim 9, wherein the reflector comprises an electrically conductive reflective surface that extends to and covers the carve out of the reflector and is electrically coupled to the heatsink core via the at least one of the at least portions of the lateral surface of the first pin that are exposed from the electrically insulating layer.

11. The LED module according to claim 6, further comprising:

a second pin that is integral with the electrically conductive heatsink core, protrudes from the surface of the heatsink core, and has at least portions of a lateral surface thereof exposed from the electrically insulating later; and a reflector mounted on the first surface of the heatsink via the second pin, the reflector comprising a carve out and an electrically conductive reflective surface extending to and covering the carve out, the carve out of the reflector touching the at least the portion of the lateral surface of the first pin that is exposed from the electrically insulating layer thereby electrically coupling the reflective surface of the reflector via the at least the portion of the lateral surface of the first pin that is exposed from the electrically insulating layer, the heatsink core, a deformed head of the first protruding pin, and the one of the electrically conductive traces of the PCB.

12. A method of manufacturing a device, the method comprising:

providing a sheet metal, anodizing a surface of the sheet metal forming an electrically insulating layer covering the surface; and forming a first pin protruding from the anodized surface of the sheet metal such that the forming the protrusion causes at least parts of a lateral surface of the pin to be exposed from the electrically insulating layer.

13. The method of claim 12, wherein the forming the first pin comprises one of stamping or deep drawing the first pin from the anodized surface of the sheet metal.

14. The method of claim 13, further comprising forming a second pin protruding from the anodized surface of the sheet metal such that the forming the protrusion causes at least parts of a lateral surface of the pin to be exposed from the electrically insulating layer.

15. The method of claim 14, further comprising:

mounting a reflector to the anodized surface of the sheet metal by at least partially inserting one of the first pin or the second pin into a through hole in the reflector; and mounting a circuit board to the anodized surface of the sheet metal by at least partially inserting the other one of the first pin or the second pin into a through hole in the circuit board.

16. The method according to claim 12, further comprising removing the electrically insulating layer in a light-emitting diode (LED) mounting area of the heatsink by grinding, milling, or laser ablating.

17. The method according to claim 16, further comprising mounting an LED in the LED mounting area.

* * * * *